US010205074B2

United States Patent
Song

(10) Patent No.: US 10,205,074 B2
(45) Date of Patent: Feb. 12, 2019

(54) CIRCUIT BOARD FOR MOUNTING OF SEMICONDUCTOR LIGHT EMITTING DEVICE AND SEMICONDUCTOR LIGHT EMITTING DEVICE PACKAGE USING THE SAME

(71) Applicant: SAMSUNG ELECTRONICS CO., LTD., Suwon-si, Gyeonggi-do (KR)

(72) Inventor: Jong Sup Song, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 31 days.

(21) Appl. No.: 15/232,234

(22) Filed: Aug. 9, 2016

(65) Prior Publication Data

US 2017/0179352 A1 Jun. 22, 2017

(30) Foreign Application Priority Data

Dec. 16, 2015 (KR) ........................ 10-2015-0179906

(51) Int. Cl.
*H01L 21/00* (2006.01)
*H01L 33/62* (2010.01)
*H01L 33/48* (2010.01)
*H01L 33/38* (2010.01)

(52) U.S. Cl.
CPC .............. *H01L 33/62* (2013.01); *H01L 33/38* (2013.01); *H01L 33/486* (2013.01); *H01L 2224/16225* (2013.01)

(58) Field of Classification Search
CPC .................. H01L 33/62; H01L 33/486; H01L 2224/16225; H01L 2224/32225; H01L 33/54; H01L 33/60
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,179,670 B2 | 2/2007 | Shelton et al. |

(Continued)

*Primary Examiner* — Charles Garber
*Assistant Examiner* — Abdulfattah Mustapha
(74) *Attorney, Agent, or Firm* — Lee & Morse P.C.

(57) ABSTRACT

A semiconductor light emitting device package includes a semiconductor light emitting device including a plurality of electrodes, a circuit board including a mounting region, the semiconductor light emitting device being positioned on the mounting region of the circuit board, and a plurality of electrode pads on the circuit board, the plurality of electrode pads being electrically connected to the plurality of electrodes, wherein each of the plurality of electrode pads includes a first region and a second region, the first region overlapping the mounting region, and the second region excluding the first region, and wherein the plurality of electrode pads is arranged in a shape of rotational symmetry around a pivot point of the mounting region.

19 Claims, 10 Drawing Sheets

(56) References Cited

U.S. PATENT DOCUMENTS

| | | |
|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,768,754 B2 | 8/2010 | Collins, III et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,492,789 B2 | 7/2013 | Hung et al. |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0042150 A1 | 2/2008 | Yamaguchi |
| 2008/0105885 A1* | 5/2008 | Watanabe ............... H01L 27/15 257/96 |
| 2008/0290353 A1* | 11/2008 | Medendorp, Jr. ..... H01L 25/167 257/89 |
| 2014/0014986 A1 | 1/2014 | Yoshida et al. |
| 2014/0226345 A1* | 8/2014 | Song ....................... H01L 33/62 362/382 |
| 2014/0252402 A1 | 9/2014 | Lee et al. |

\* cited by examiner

I - I'

CIRCUIT BOARD FOR MOUNTING OF SEMICONDUCTOR LIGHT EMITTING DEVICE AND SEMICONDUCTOR LIGHT EMITTING DEVICE PACKAGE USING THE SAME

CROSS-REFERENCE TO RELATED APPLICATION

Korean Patent Application No. 10-2015-0179906, filed on Dec. 16, 2015, in the Korean Intellectual Property Office, and entitled: "Circuit Board for Mounting of Semiconductor Light Emitting Device and Semiconductor Light Emitting Device Package Using the Same," is incorporated by reference herein in its entirety.

BACKGROUND

1. Field

The present disclosure relates to a circuit board for the mounting of a semiconductor light emitting device thereon and to a semiconductor light emitting device package using the same.

2. Description of the Related Art

Circuit boards used to mount light emitting devices thereon play a role in easily connecting devices of various electronic products according to predetermined designs, and are widely used in various electronic products ranging from home appliances, e.g., digital televisions (TVs) to advanced telecommunications equipment. However, electronic devices, e.g., semiconductor light emitting devices, mounted on a circuit board may have bonding limitations due to a high bonding temperature required when being bonded to a circuit board.

SUMMARY

An aspect of the present disclosure may provide a semiconductor light emitting device mounted on a circuit board with improved product reliability due to reduced defects, e.g., defects caused by thermal stress applied to the semiconductor light emitting device and by an imbalance in an amount of a bonding material during bonding, and a semiconductor light emitting device package using the same.

A semiconductor light emitting device package according to an aspect of the present disclosure may include a semiconductor light emitting device including a plurality of electrodes and a circuit board having a surface on which a plurality of electrode pads electrically connected to the plurality of electrodes, respectively, are disposed. Each of the plurality of electrode pads may include a first region overlapping a region in which the semiconductor light emitting device is mounted and a second region, except for the first region, and the plurality of electrode pads may be disposed in a shape of rotational symmetry around a pivot point of the region in which the semiconductor light emitting device is mounted.

A semiconductor light emitting device package according to another aspect of the present disclosure may include a circuit board having a surface on which a plurality of electrode pads having first and second regions formed of materials having different compositions, respectively, and a semiconductor light emitting device mounted in the first regions of the plurality of electrode pads. The plurality of electrode pads may be disposed in a shape of rotational symmetry around a pivot point of a region in which the semiconductor light emitting device is mounted.

A circuit board for mounting of a semiconductor light emitting device according to yet another aspect of the present disclosure may include a base substrate having first and second surfaces opposing each other and a plurality of electrode pads disposed on the first surface of the base substrate. The plurality of electrode pads may be disposed in a shape of rotational symmetry around a central region of the base substrate when seen from above the base substrate.

A semiconductor light emitting device package according to still another aspect of the present disclosure may include a semiconductor light emitting device including a plurality of electrodes, a circuit board, the semiconductor light emitting device being positioned on the circuit board, and a plurality of electrode pads on the circuit board, the plurality of electrode pads being electrically connected to the plurality of electrodes of the semiconductor light emitting device, respectively, wherein each of the plurality of electrode pads includes a first region and a second region, the first and second regions including different material layers, and the semiconductor light emitting device overlapping only the first region among the first and second regions of each of the electrode pads.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, embodiments of the present disclosure will be described as follows with reference to the attached drawings.

In a description of example embodiments of the present disclosure, a Miller index expressed by three sets of integers is used as a notation describing a crystallographic plane or direction. A plurality of planes and directions having the same relative symmetry with respect to a crystallographic axis are equivalent in the crystallographic terms. In addition, a plane and direction having a given Miller index may move within a lattice by only a method of selecting a position and orientation of a unit cell. The equivalent planes and directions may be marked as a single family. Furthermore, a description of a family, for example, a single plane belonging to a crystal face {100} may be equally applied to three equivalent planes (100), (010), and (001), as long as there is not a different description.

Figure 1:
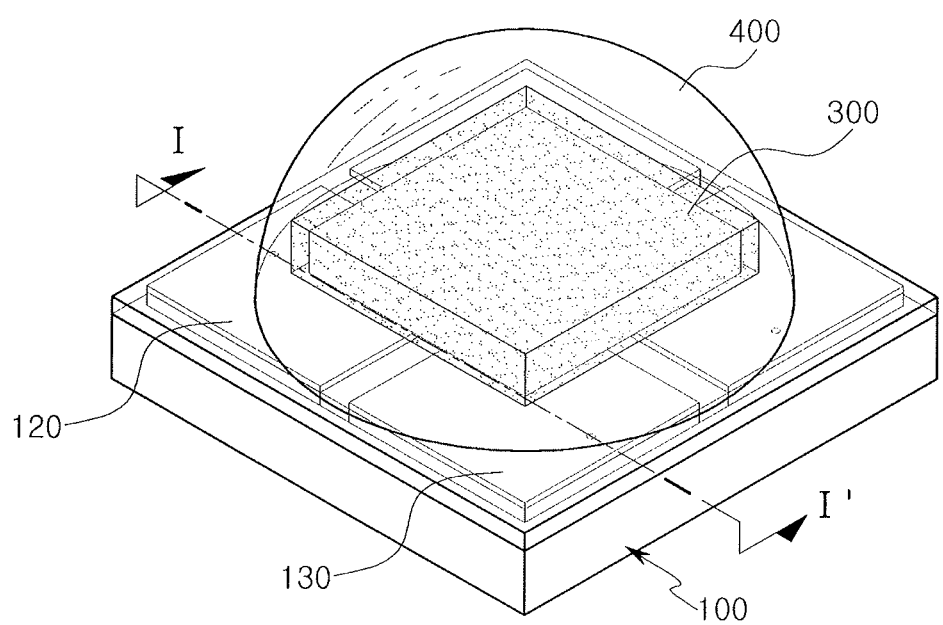
FIG. 1 illustrates a perspective view of a semiconductor light emitting device package according to an example embodiment of the present disclosure.
Figure 2:
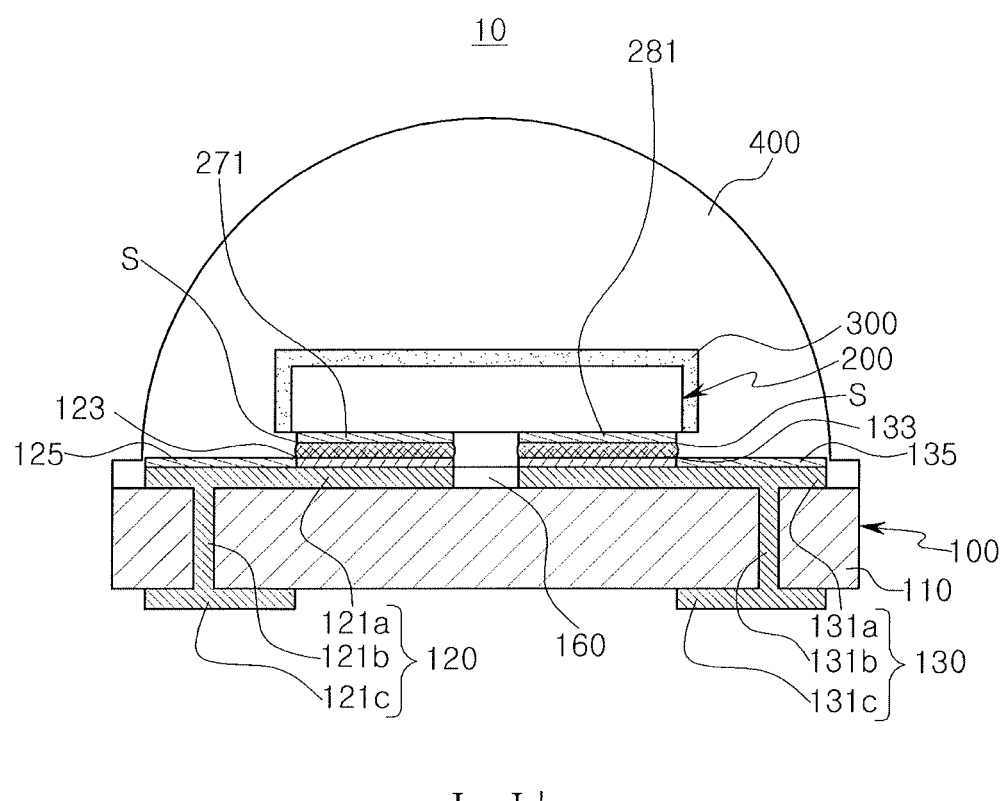
FIG. 2 illustrates a cross-sectional view taken along line I-I' of the semiconductor light emitting device illustrated in FIG. 1.
Figure 3:
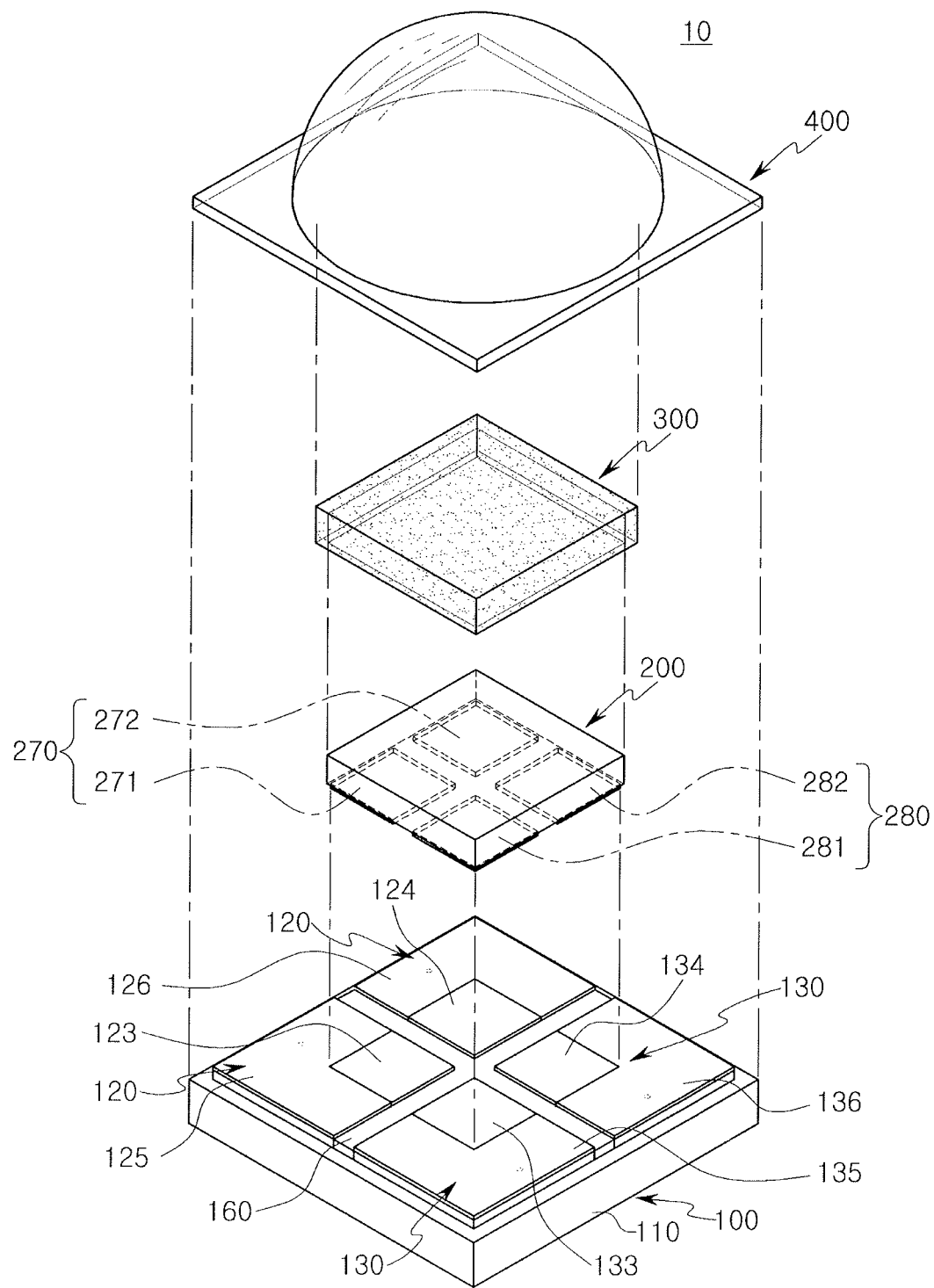
FIG. 3 illustrates an exploded perspective view of the semiconductor light emitting device package illustrated in FIG. 1.
Figure 4:
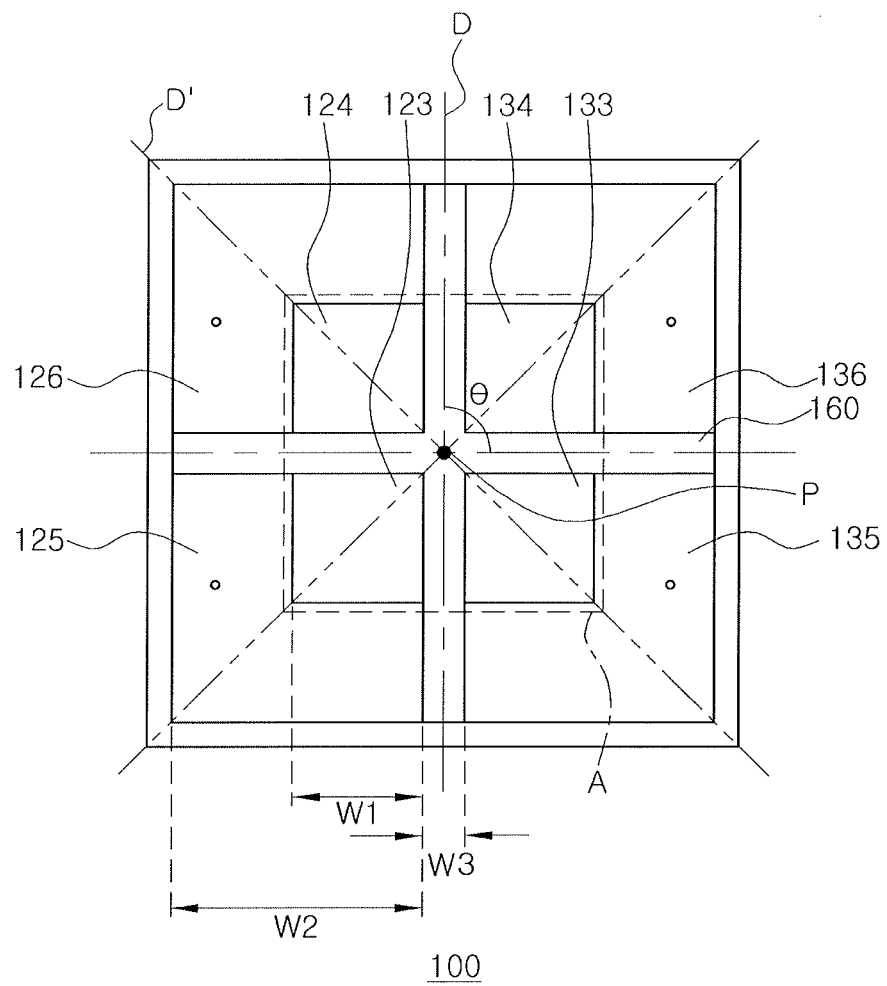
FIG. 4 illustrates a view of a circuit board illustrated in FIG. 3, seen from above.
Figure 5:
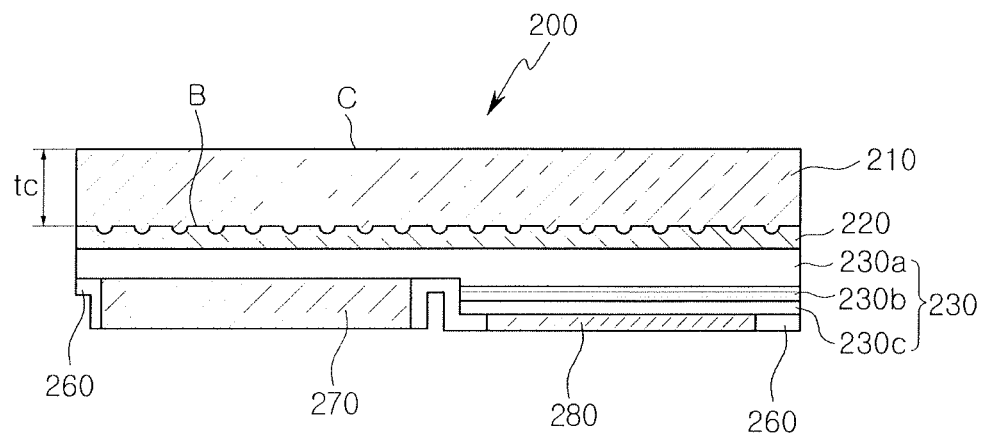
FIG. 5 illustrates a cross-sectional view of a semiconductor light emitting device employed in the semiconductor light emitting device package illustrated in FIG. 1.

FIG. 1 is a perspective view of a semiconductor light emitting device package according to an example embodiment of the present disclosure, and FIG. 2 is a cross-sectional view taken along line I-I' of the semiconductor light emitting device package illustrated in FIG. 1. FIG. 3 is an exploded perspective view of the semiconductor light emitting device package illustrated in FIG. 1, and FIG. 4 is a view of the circuit board illustrated in FIG. 3, as seen from a top view. FIG. 5 is a cross-sectional view of a semiconductor light emitting device employed in the semiconductor light emitting device package illustrated in FIG. 1.

With reference to FIGS. 1 and 2, a semiconductor light emitting device package 10 according to an example embodiment of the present disclosure may include a semiconductor light emitting device 200 provided with a plurality of electrodes 271 and 281 thereon, and a circuit board 100 on which the semiconductor light emitting device 200 is mounted. In addition, the semiconductor light emitting device package 10 may further include a bonding material S bonding the semiconductor light emitting device 200 on the circuit board 100.

With reference to FIG. 5, the semiconductor light emitting device 200 may include a light transmitting substrate 210 having a first surface B and a second surface C opposing the first surface B, a light emitting structure 230 disposed on the first surface B of the light transmitting substrate 210, and a first electrode 270 and a second electrode 280 connected to the light emitting structure 230, respectively.

The light transmitting substrate 210 may be a substrate for the growth of a semiconductor including a material such as sapphire, SiC, $MgAl_2O_4$, MgO, $LiAlO_2$, $LiGaO_2$, GaN, or the like. In this case, sapphire is a crystal having Hexa-Rhombo R3c symmetry, has lattice constants of 13.001 Å and 4.758 Å in directions of the c-axis and the a-axis, respectively, and includes a C plane (0001), an A plane (11-20), an R plane (1-102), or the like. In this case, since a nitride thin film may be relatively easily grown on the C plane, which is stable at relatively high temperatures, the C plane is commonly used for a nitride growth substrate.

The light transmitting substrate 210 may include surfaces opposing each other, and an unevenness structure may be formed on at least one of the opposing surfaces. The unevenness structure may be provided by etching a portion of the light transmitting substrate 210 or by forming a hetero material layer different from the light transmitting substrate 210.

As illustrated in FIG. 5, in the case in which an unevenness structure is formed, e.g., directly, on the first surface B of the light transmitting substrate 210 provided as a growth surface of the light emitting structure 230, stress caused by a difference in crystal constants at an interface between the light transmitting substrate 210 and a first conductive semiconductor layer 230a may be reduced. That is, the unevenness structure is between the transmitting substrate 210 and the light emitting structure 230.

For example, in a case in which a group III nitride-based semiconductor layer is grown, e.g., directly, on a sapphire substrate, a difference in lattice constants between the sapphire substrate and the group III nitride-based compound semiconductor layer may cause a dislocation defect. The dislocation defect may propagate from the substrate toward the semiconductor layer, leading to deterioration in quality of the semiconductor layer crystal. Therefore, in the example embodiment, as the unevenness structure including convex portions is provided, e.g., directly, on the light transmitting substrate 210, the first conductive semiconductor layer 230a is grown, e.g., directly, on sides of the convex portions, thereby preventing the dislocation defect from propagating from the light transmitting substrate 210 to the first conductive semiconductor layer 230a.

Thus, a high-quality light emitting diode package may be provided, thereby increasing internal quantum efficiency. In addition, since the unevenness structure may lead to a path of light emitted by an active layer 230b, being varied, a rate of light absorbed within a semiconductor layer may be decreased, and a light scattering rate may be increased so that light extraction efficiency may be improved.

A thickness to of the light transmitting substrate 210 may be about 100 μm or less, e.g., about 1 μm to 20 about μm, but is not limited thereto. The range of thickness may be obtained by polishing a growth substrate for semiconductor growth. In detail, the growth substrate may be polished by grinding the second surface C or by a method of lapping, in which the growth substrate is polished by a function of wear and grinding using a lap and lapping powder, or the like.

A buffer layer 220 may be disposed between the light transmitting substrate 210 and the light emitting structure 230. For example, if the light emitting structure 230 were to be grown, e.g., directly, on the light transmitting substrate 210, e.g., if a GaN layer is grown as a light emitting structure on a hybrid substrate, a lattice constant mismatch between the light transmitting substrate 210 and the light emitting structure 230 could cause a lattice defect, e.g., dislocation, and a difference in thermal expansion coefficients could lead to the light transmitting substrate 210 being warped, thus causing cracks in the light transmitting substrate 210. Therefore, according to embodiments, in order to control the occurrence of defects and warping, after the buffer layer 220 is formed on the light transmitting substrate 210, a light emitting structure having a required structure, e.g., a nitride semiconductor, may be formed on the buffer layer 220. The buffer layer 220 may be a low-temperature buffer layer formed at a lower temperature than a temperature for the growth of a single crystal, but is not limited thereto.

For example, a material for forming the buffer layer 220 may be $Al_xIn_yGa_{1-x-y}N$ (0≤x≤1, 0≤y≤1), e.g., GaN, AlN, and AlGaN. For example, the buffer layer 220 may be formed of an undoped GaN layer formed at a uniform thickness without being doped with an impurity.

A material forming the buffer layer 220 is not limited to the above examples. Thus, any structure improving crystallizability of the light emitting structure 230 may be employed, e.g., $ZrB_2$, $HfB_2$, ZrN, HfN, TiN, ZnO, or the like may also be used. In addition, the buffer layer 220 may also be used as a layer combining a plurality of layers or gradually changing a composition thereof.

The light emitting structure 230 may include the first conductive semiconductor layer 230a, the active layer 230b, and a second conductive semiconductor layer 230c, sequentially disposed on one surface of the light transmitting substrate 210. The first and second conductive semiconductor layers 230a and 230c may be n-type and p-type semiconductor layers, respectively, and may include a nitride semiconductor. Thus, in the example embodiment, the first and second conductive semiconductor layers 230a and 230c may mean an n-type nitride semiconductor layer and a p-type nitride semiconductor layer, respectively, but the first and second conductive semiconductor layers 230a and 230c are not limited thereto. The first and second conductive semiconductor layers 230a and 230c may include a material having an empirical formula $Al_xIn_yGa_{(1-x-y)}N(0≤x≤1, 0≤y≤1, 0≤x+y≤1)$, e.g., GaN, AlGaN, InGaN, or the like.

The active layer 230b may be a layer for emitting visible light, i.e., a layer having a wavelength in a range of about 350 nm to about 680 nm, and may be configured of an undoped nitride semiconductor layer having a structure of a single quantum well or a multiple quantum well (MQW). For example, the active layer 230b may be formed in a structure of a multiple quantum well in which a quantum barrier layer and a quantum well layer, having an empirical formula $Al_xIn_yGa_{(1-x-y)}N(0≤x≤1, 0≤y≤1, 0≤x+y≤1)$, are alternately stacked, thus using a structure having a determined band gap. The quantum well recombines an electron and a hole, thereby emitting light. For example, in the case of the multiple quantum well structure, an InGaN/GaN structure may be used. The first and second conductive semiconductor layers 230a and 230c and the active layer 230b may be formed by using a crystal growth process, e.g., metal organic chemical vapor deposition (MOCVD), molecular beam epitaxy (MBE), hydride vapor phase epitaxy (HVPE), or the like.

The first and second electrodes 270 and 280 are provided to supply power to the first and second conductive semiconductor layers 230a and 230c, respectively. The first and second electrodes 270 and 280 may be provided to be connected to the first and second conductive semiconductor layers 230a and 230c, respectively.

The first and second electrodes 270 and 280 may include a conductive material in a single or multilayer structure, having ohmic characteristics with respect to the first and second conductive semiconductor layers 230a and 230c. For example, the first and second electrodes 270 and 280 may be formed by evaporating one or more material among Au, Ag, copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), a transparent conductive oxide (TCO), and the like, using, e.g., sputtering.

The first and second electrodes 270 and 280 may be disposed in the same direction to oppose the light transmitting substrate 210, based on the light emitting structure 230. In other words, as illustrated in FIG. 5, the first and second electrodes 270 and 280 may be disposed on a same side, i.e., surface, of the light emitting structure 230, such that the light transmitting substrate 210 is on an opposite side of the light emitting structure 230 with respect to the first and second electrodes 270 and 280. Thus, the semiconductor light emitting device 200 may be flip-chip or eutectic bonded to a mounting surface thereof. In this case, light emitted from the active layer 230b may be emitted externally via the light transmitting substrate 210. In addition, according to an example embodiment, in order for light not reflected in the first and second electrodes 270 and 280 to be able to be reflected, a lower reflective layer 260 may be disposed to cover a region of the light emitting structure 230, except for a region thereof in which the first and second electrodes 270 and 280 are disposed.

According to an example embodiment, as illustrated in FIG. 3, each of the first and second electrodes 270 and 280 may include a plurality of electrodes, e.g., respective electrodes 271, 272, 281, and 282. The example embodiment describes a case in which each of the first and second electrodes 270 and 280 includes two electrodes, respectively, as an example. In this case, the plurality of electrodes 271, 272, 281, and 282 may be disposed to have the same shape. In addition, the plurality of electrodes 271, 272, 281, and 282 may be disposed while having shapes corresponding to those of the first regions 123, 124, 133, and 134 of the circuit board 100 on which the semiconductor light emitting device 200 is mounted, thus further improving thermal conductivity characteristics of the first regions 123, 124, 133, and 134.

In the example embodiment, the semiconductor light emitting device 200 is illustrated as being mounted as a single device, but is not limited thereto. For example, the semiconductor light emitting device 200 may be mounted as a plurality of devices on the circuit board 100, e.g., the plurality of semiconductor light emitting devices 200 may be homogeneous devices emitting light having the same wavelength or heterogeneous devices emitting light having wavelengths different from each other.

In addition, the example embodiment illustrates a case in which the semiconductor light emitting device 200 is a light emitting diode (LED) chip, but is not limited thereto. For example, the semiconductor light emitting device 200 may include a single package including an LED chip therein.

Referring to FIGS. 1-3, the case of the circuit board 100 may include a base substrate 110 with a plurality of electrode pads 120 and 130 thereon. For example, the base substrate may be a support substrate on which the semiconductor light emitting device 200, i.e., an electronic device, is to be mounted. The circuit board 100 may be a printed circuit board (PCB). In addition, the circuit board 100 may be a package body supporting the semiconductor light emitting device 200.

The plurality of electrode pads 120 and 130 may be disposed, e.g., directly, on the circuit board 100, and may be electrically connected to the electrodes 270 and 280 of the semiconductor light emitting device 200. Each of the electrode pads 120 and 130 may include a first region, i.e., a region for contacting a corresponding electrode of the electrodes 270 and 280, and a second region, i.e., a region other than the first region. That is, as illustrated in FIG. 3, the electrode pads 120 and 130 include respective ones of the first regions 123, 124, 133, and 134, i.e., junction regions defining positions on which the semiconductor light emitting device 200 is mounted via the electrodes 270 and 280, and respective ones of second regions 125, 126, 135, and 136, i.e., regions other than the first regions 123, 124, 133, and 134.

In detail, as illustrated in FIG. 2, the base substrate 110 may have a shape of a plate having first and second surfaces opposing each other. For example, the base substrate 110 may be formed of an organic resin material containing, e.g., epoxy, triazine, silicone, polyimide, or the like, and other organic resin materials. I another example, in order to improve thermal characteristics and luminous efficiency, the base substrate 110 may be formed of a ceramic material having characteristics of high thermal resistance, excellent thermal conductivity, high reflection efficiency, and the like. For example, the base substrate 110 may include a material such as $Al_2O_3$, AlN, or the like. However, a material of the base substrate 110 is not limited thereto, and the base substrate 110 including various materials may be used in consideration of thermal characteristics of the semiconductor light emitting device 200, electrical connectivity, or the like. In yet another example, a printed circuit board, a lead frame, or the like may be used as the base substrate 110 in the example embodiment. In addition, the base substrate 110 may be cup-shaped to improve light reflection efficiency.

The electrode pads 120 and 130 may include first and second electrode pads 120 and 130 having first and second polarities, respectively. The first and second electrode pads 120 and 130 may be provided in such a manner that first and second through electrodes 121b and 131b penetrate through one surface and the other surface of the base substrate 110 on which the semiconductor light emitting device 200 is mounted, and first and second upper electrode pads 121a and 131a, and first and second lower electrode pads 121c and 131c are disposed on the one surface and the other surface of the base substrate 110 on which opposing ends of the first and second through electrodes 121b and 131b are exposed, respectively. For example, the first electrode pad 120 may include a first upper electrode 121a on an upper surface, i.e., a surface facing the semiconductor light emitting device 200, of the base substrate 110, a first lower electrode pad 121c on a lower surface, i.e., a surface opposite the upper surface, of the base substrate 110, and the first through electrode 121b extending through the base substrate 110 and connecting the first lower and upper electrodes 121a and 121c. The second electrode pad 130 may have a same structure as the first electrode pad 120. Thus, the two, opposite, surfaces of the base substrate 110 may be electrically connected to each other.

The first and second through electrodes 121b and 131b, the first and second upper electrode pads 121a and 131a, and the first and second lower electrode pads 121c and 131c may be formed by disposing a conductive material, e.g., Au, Ag, Cu, Zn, Al, In, Ti, Si, Ge, Sn, Mg, Ta, Cr, W, Ru, Rh, Ir, Ni, Pd, and Pt in a single or multilayer structure. In addition, the first and second through electrodes 121b and 131b, the first and second upper electrode pads 121a and 131a, and the first and second lower electrode pads 121c and 131c may be separately manufactured, but may also be manufactured simultaneously through a batch process. The example embodiment describes a case in which an electrode pad is formed of Cu through a direct plating method as an example.

As illustrated in FIGS. 3 and 4, when seen from above, the first and second electrode pads 120 and 130 may be disposed in a shape of rotational symmetry around a pivot point P of a region A in which the semiconductor light emitting device 200 is mounted. For example, the first electrode pad having numerical reference number 134 in the drawing may have a rotational symmetry of θ degrees around P with respect to the first electrode pad having numerical reference number 133. Reference character D is a virtual split line dividing a plurality of first and second electrode pads 120 and 130, e.g., reference character D is an imaginary line through the pivot point P to separate the first and second electrode pads 120 and 130 to different parts of the base substrate 110. For example, D' may become a position D rotated 45 degrees in a clockwise direction around P.

In the example embodiment, two first electrode pads 120 and two second electrode pads 130 are disposed on the base substrate 110 based on the pivot point P. The two first electrode pads 120 and two second electrode pads 130 are oriented at 90 degrees (θ) with respect to each other.

With reference to FIGS. 2 and 3, in the case of the first and second electrode pads 120 and 130, the first regions 123, 124, 133, and 134, and the second regions 125, 126, 135, and 136 are coated with conductive materials having different compositions on the first and second upper electrode pads 121a and 131a on which the semiconductor light emitting device 200 is mounted. T In detail, as illustrated in FIG. 4, each of the first regions 123, 124, 133, and 134 may have a width of W1 in a region overlapping a region A in which the semiconductor light emitting device 200 is mounted. In addition, each of the second regions 125, 126, 135, and 136 may be disposed in a width of W2 to surround the first regions 123, 124, 133, and 134 in an edge region of the circuit board 100. That is, as illustrated in FIG. 4, each of the first and second electrode pads 120 and 130 has a total width W2, with the first region in each of the first and second electrode pads 120 and 130 having a width W1, which is smaller than the total width W2. Therefore, each second region in each of the first and second electrode pads 120 and 130 is positioned within the total width W2 while being outside the width W1 of the corresponding first region. For example, as illustrated in FIG. 4, each first region in each of the first and second electrode pads 120 and 130 may be positioned adjacent to the pivot point P, i.e., to define a portion of the region A (in a center of the base substrate 110), while each second region in each of the first and second electrode pads 120 and 130 may extend along two outer surfaces of a corresponding first region, i.e., to define a portion of a region outside the region A (in a periphery of the base substrate 110). Therefore, as illustrated in FIGS. 3-4, the semiconductor light emitting device 200 may be positioned on the region A defined by the first regions 123, 124, 133, and 134.

The first regions 123, 124, 133, and 134 may have the same shape as first and second electrodes 271, 272, 281, and 282 of the semiconductor light emitting device 200, respectively, and may be connected thereto, respectively. In addition, the first regions 123, 124, 133, and 134 may be formed to have the same size. Accordingly, when the semiconductor light emitting device 200 is mounted on the region A, each of the first and second electrodes 271, 272, 281, and 282 is positioned to contact and overlap a corresponding one of the first regions 123, 124, 133, and 134. Further, an amount of solder paste with which the first regions 123, 124, 133, and 134 are coated to connect to corresponding ones of the first and second electrodes 271, 272, 281, and 282 is kept uniform.

In the case that the amount of solder paste with which an electrode pad is coated is not uniform, a tomb-stone defect, i.e., when one end of a mounted semiconductor light emitting device is pulled upwardly due to a large amount of solder paste, may be caused by surface tension of the solder paste. Therefore, in the example embodiment, since sizes of the first and second electrode pads are the same, the amount of coated solder paste may be kept uniform. Thus, the occurrence of the tomb-stone defect may be prevented. In addition, since shapes of the first and second electrode pads are the same, the same amount of heat is emitted through respective pads. Thus, thermal stress caused by heat building up in a pad may be prevented.

The first regions 123, 124, 133, and 134 may be plated with a material having excellent bondability, e.g., gold (Au). Thus, bonding characteristics with respect to the first and second electrodes 271, 272, 281, and 282 may be improved. In addition, the material with which the first regions 123, 124, 133, and 134 are plated, may have the same composition as the bonding material S bonding the semiconductor light emitting device 200 to the circuit board 100.

The bonding material S may include a conductive material having bondability. For example, the bonding material S may include Au and/or a eutectic metal, e.g., Au/Ge, Au/In, Au/Sn, or the like. Thus, the first regions 123, 124, 133, and 134 may include a material having the same composition as the bonding material S, thereby having excellent bonding characteristics. In addition, bonding reliability of the semiconductor light emitting device 200 mounted in the first regions 123, 124, 133, and 134 may be secured.

The second regions 125, 126, 135, and 136 may be defined as regions on the first electrode pads 120 and 130 that exclude region A, i.e., the second regions 125, 126, 135, and 136 are in a region, e.g., completely, outside a region in which the semiconductor light emitting device 200 is mounted. The second regions 125, 126, 135, and 136 may be disposed in a rotational symmetrical shape in regions of the first and second upper electrode pads 121a and 131a corresponding to the edge region of the circuit board 100. The second regions 125, 126, 135, and 136 may be plated with a material having a higher degree of reflectance than that of a material with which the first regions 123, 124, 133, and 134 are plated. In an example embodiment, the second regions 125, 126, 135, and 136 may be plated with, e.g., silver (Ag). Since the plating material of the second regions 125, 126, 135, and 136 has relatively low bondability and a higher degree of reflectance than that of the plating material of the first regions 123, 124, 133, and 134, an amount of reflected light emitted from the semiconductor light emitting device 200 may be increased. Thus, external light extraction efficiency of the semiconductor light emitting device package 10 may be improved.

Referring back to FIG. 4, the insulating reflective layer 160 may separate between the first and second electrode pads 120 and 130, e.g., the insulating reflective layer 160 may have a "+" shape. The insulating reflective layer 160 may have a width W3 between the first regions 123, 124, 133, and 134, e.g., the insulating reflective layer 160 may have a width W3 between every two adjacent first regions of the first regions 123, 124, 133, and 134. Since the insulating reflective layer 160 may include an insulating material having a high degree of reflectance. e.g., $TiO_2$, $SiO_2$. SiN, $Si_3N_4$, $Al_2O_3$, TiN, AlN, $ZrO_2$, TiAlN, TiSiN, and $Nb_2O_3$, the insulating reflective layer 160 may reflect light emitted from the semiconductor light emitting device 200 at a relatively high degree of reflectance. Thus, light emitted from the semiconductor light emitting device 200 may be effectively prevented from being absorbed into the base substrate 110 exposed between the first and second electrode pads 120 and 130. Furthermore, the insulating reflective layer 160 may electrically insulate between a plurality of electrode pads 120 and 130, thereby preventing short-circuiting among the first and second regions during plating of the first and second regions. According to an example embodiment, the insulating reflective layer 160 may be extended to the second regions 125, 126, 135, and 136.

In the case of the circuit board 100 having the above described configuration, the first and second electrode pads 120 and 130 having the same shape may be disposed in a rotational symmetrical shape, thereby effectively preventing a defect which may occur when the semiconductor light emitting device 200 is mounted, and preventing heat from building up in a portion of the semiconductor light emitting device 200. In addition, the first regions 123, 124, 133, and 134 coated with a material having excellent bonding characteristics and the second regions 125, 126, 135, and 136 coated with a material having a relatively high degree of reflectance may be disposed on the first and second electrode pads 120 and 130, respectively, thereby improving bonding reliability of the semiconductor light emitting device 200 and external light extraction efficiency simultaneously.

As illustrated in FIG. 2, a wavelength conversion layer 300 may be disposed on, e.g., the entirety of the, upper and side surfaces of the light emitting device 200. The wavelength conversion layer 300 may include a phosphor or a quantum dot. In addition, the wavelength conversion layer 300 may be formed in a sheet shape having a substantially uniform thickness. The wavelength conversion layer 300 may also be a film in which a material, e.g., phosphor, is distributed in a semi-curable material (B-stage) that is in a semi-curable state at room temperature and is changed into a state of being flowable when heated. In detail, the semi-curable material may be B-stage silicone.

The wavelength conversion layer 300 may be a structure including a single layer, but may also be formed in a multilayer structure. For example, when the wavelength conversion layer 300 is formed in a multilayer structure, each layer may also include different types of phosphors, and the like.

The wavelength conversion layer 300 may be formed by mixing a semi-curable resin material with a phosphor, a quantum dot, or the like. For example, the wavelength conversion layer 300 may be a B-stage composite in which a phosphor is mixed with a polymer binder including a resin, a hardener, a hardening catalyst, and the like.

As a phosphor, a garnet-based phosphor, e.g., YAG, TAG, and LuAG, a silicate-based phosphor, a nitride-based phosphor, a sulphide-based phosphor, an oxide-based phosphor, or the like may be used. Furthermore, a phosphor may be a single phosphor or a plurality of phosphors mixed at a determined ratio.

As a resin used in the wavelength conversion layer 300, e.g., an epoxy resin or a silicone resin, an inorganic polymer, satisfying requirements for high bondability, high light transmittance, high thermal resistance, high light refractive index, moisture resistance, and the like may be used. For example, in order to secure high bondability, a silane material may be employed as an additive to improve adhesion.

A lens unit 400 may be further formed on the wavelength conversion layer 300. The lens unit 400 may be disposed to cover the semiconductor light emitting device 200 and the wavelength conversion layer 300. The lens unit 400 may control distribution of light emitted from the light emitting structure 230 of the semiconductor light emitting device 200 by adjusting a surface shape thereof. The lens unit 400 may be formed of a light transmissive material. In detail, the lens unit 400 may include an insulating resin having light transmittance, e.g., a composite formed of silicone, strained silicone, epoxy, urethane, oxetane, acryl, polycarbonate, polyimide, and combinations thereof, but is not limited thereto. A material having relatively high light transmittance, e.g., glass and silicagel, may also be used.

Figure 6:
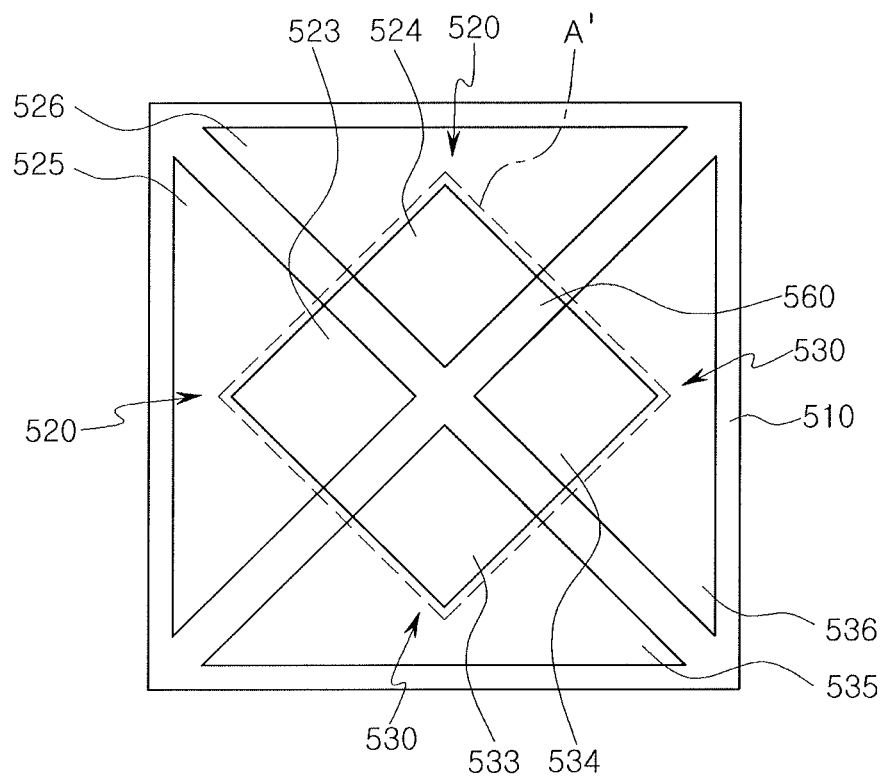
FIG. 6 illustrates another example embodiment of the circuit board in FIG. 3.

Next, another example embodiment of the foregoing circuit board 100 will be described. A description overlapping the description of the foregoing example embodiment will be omitted. FIG. 6 is another example embodiment of the circuit board illustrated in FIG. 3.

In a similar manner to the circuit board 100 described above according to the foregoing example embodiment, a circuit board 500 in another example embodiment may include first and second electrode pads 520 and 530. The first and second electrode pads 520 and 530 may be configured of a plurality of electrode pads, respectively. Furthermore, the first and second electrode pads 520 and 530 may include first regions 523, 524, 533, and 534 disposed in a central region A' of a base substrate 510 and second regions 525, 526, 535, and 536 disposed in an edge region of the base substrate 510, respectively. Different from the foregoing example embodiment, the present example embodiment includes an insulating reflective layer 560 dividing an electrode pad into the first and second electrode pads 520 and 530 along a virtual diagonal line connecting corners of a base substrate 510, e.g., rather than center points of edges of a base substrate. Additionally, the example embodiment is different in that the insulating reflective layer 560 is disposed only in a region A'. Even in a case in which the insulating reflective layer 560 is limitedly disposed in only the region A', a degree of reflectance of a surface of the insulating reflective layer 560 contacting a semiconductor light emitting device may be maintained. Thus, degrees of entire reflectance may be maintained identical to the case of the foregoing example embodiment, and a manufacturing cost of the insulating reflective layer 560 may be reduced.

Figure 7:
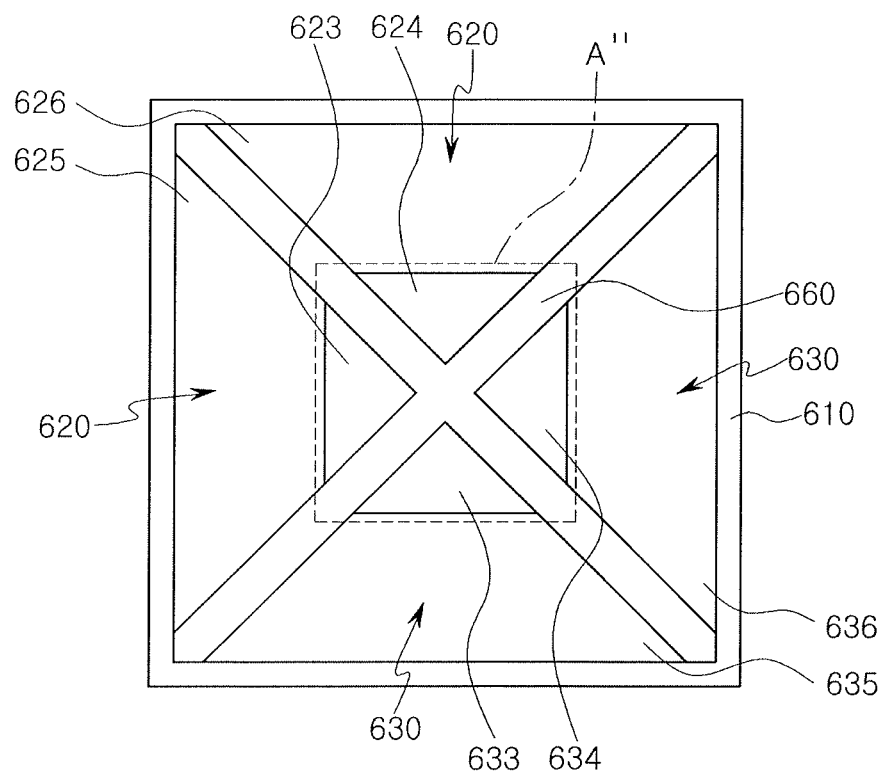
FIG. 7 illustrates another example embodiment of the circuit board in FIG. 3.

Another example embodiment of the circuit board will be described. A description overlapping the description of the foregoing example embodiment will be omitted. FIG. 7 is another example embodiment of the circuit board 100 illustrated in FIG. 3.

In a similar manner to the foregoing circuit board 100 in an example embodiment, a circuit board 600 according to another example embodiment may include first and second electrode pads 620 and 630, and the first and second electrode pads 620 and 630 may be configured of a plurality of electrode pads, respectively. Furthermore, the first and second electrode pads 620 and 630 may include first regions 623, 624, 633, and 634 disposed in a region A" of a base substrate 610 and second regions 625, 626, 635, and 636 disposed at an edge of the region A", respectively. In the example embodiment, an insulating reflective layer 660 dividing an electrode pad into the first and second electrode pads 620 and 630 is disposed along a virtual diagonal line connecting corners of a base substrate 610. In addition, in the example embodiment, the first regions 623, 624, 633, and 634 are disposed in a shape of an isosceles triangle.

With reference to FIGS. 8 to 12, a method of manufacturing the semiconductor light emitting device package 10 illustrated in FIG. 1 will be described. FIGS. 8 to 12 are views illustrating stages in a process of manufacturing the semiconductor light emitting device package 10 in FIG. 1.

Figure 8:
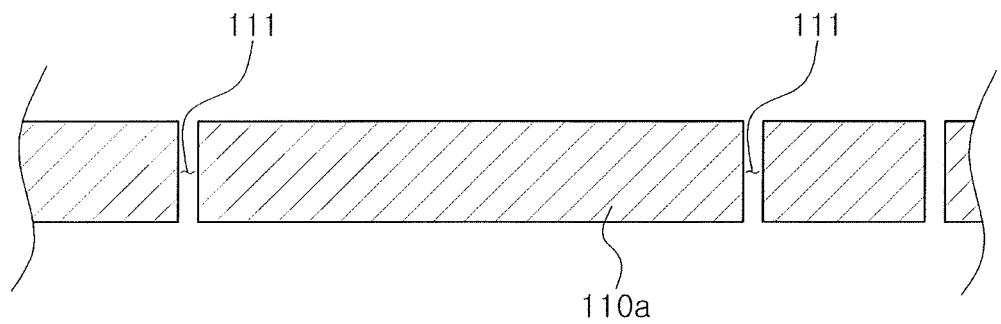
FIGS. 8 through 12 illustrate views of operations in a process of manufacturing the semiconductor light emitting device package illustrated in FIG. 1.

First, as illustrated in FIG. 8, the base substrate 110a is prepared, and a via 111 is formed in a region in which a through electrode will be formed. The via 111 may be formed by a laser drilling method, but is not limited thereto.

Figure 9:
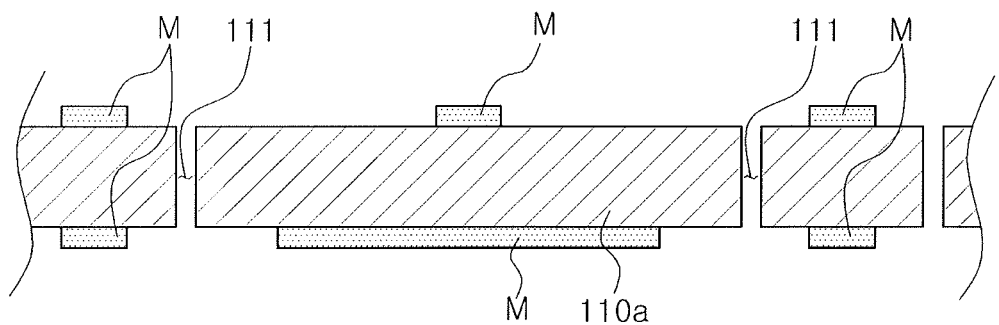

Next, as illustrated in FIG. 9, in order to define a region in which an electrode pad will be formed, two surfaces of the base substrate 110a, opposing each other, are provided with a mask M to form first and second upper electrode pads and first and second lower electrode pads thereon, respectively.

Figure 10:
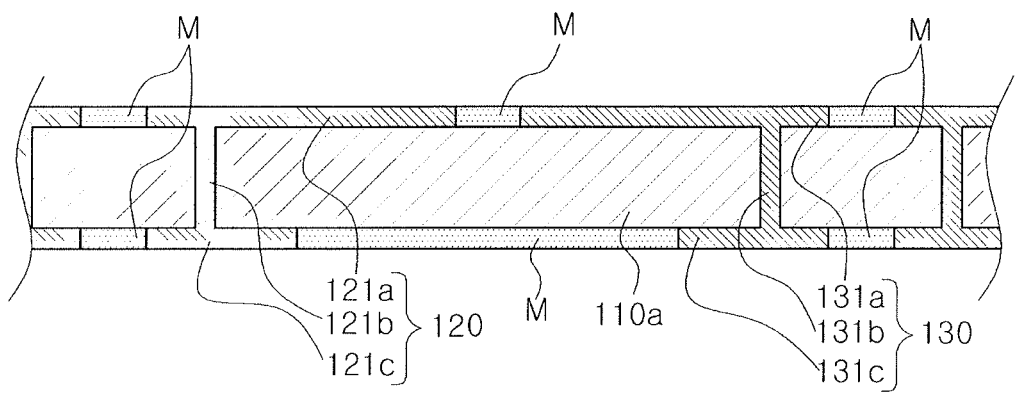

Then, as illustrated in FIG. 10, first and second electrode pads 120 and 130 are formed in a region of the base substrate 110a, except for a region thereof in which the mask M is disposed. For example, exposed surfaces of the base substrate 110a, i.e., regions not covered by the mask M, may be metal plated to form the first and second electrode pads 120 and 130. In the example embodiment, the first and second upper electrode pads 121a and 131a, the first and second through electrodes 121b and 131b, and the first and second lower electrode pads 121c and 131c may be formed through Cu plating via a direct batch plating process.

Figure 11:
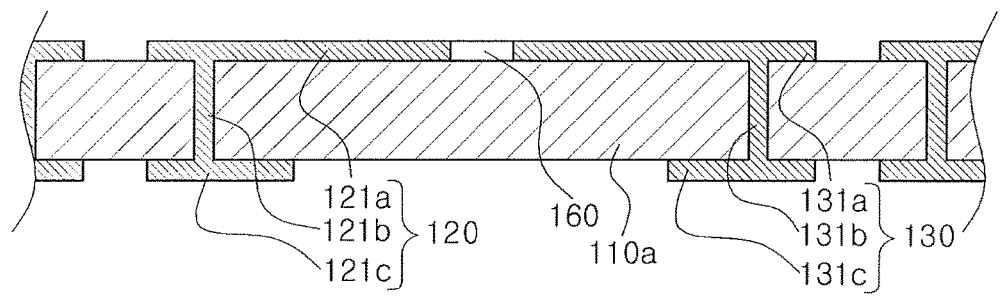

As illustrated in FIG. 11, after the mask M is removed to expose a portion of the surface of the base substrate 110a, the insulating reflective layer 160 may be formed on some of the exposed surface, i.e., between the first and second upper electrode pads 121a and 131a. The insulating reflective layer 160 may be formed between the first and second upper electrode pads 121a and 131a by coating an insulating material having a high degree of reflectance, e.g., $TiO_2$, $SiO_2$, SiN, $Si_3N_4$, $Al_2O_3$, TiN, AlN, $ZrO_2$, TiAlN, TiSiN, and $Nb_2O_3$. The insulating reflective layer 160 may electrically insulate between the first and second upper electrode pads 121a and 131a, thereby effectively preventing short-circuiting between the first and second upper electrode pads 121a and 131a in a subsequent process in which surfaces of the first and second upper electrode pads 121a and 131a are plated.

Figure 12:
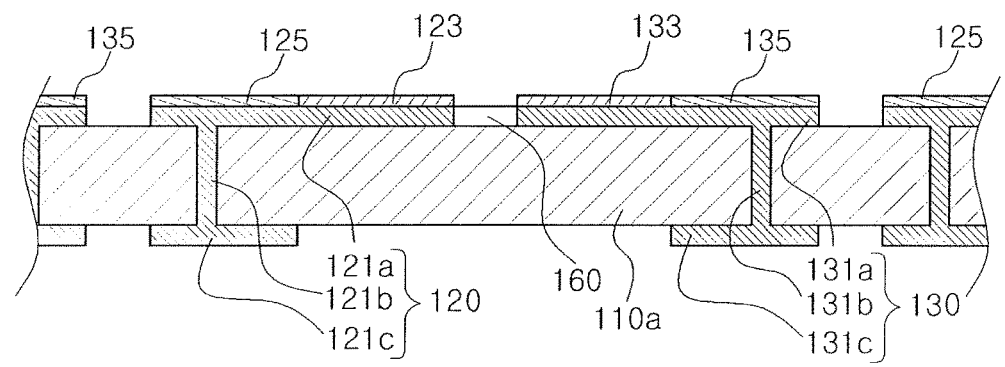

Subsequently, as illustrated in FIG. 12, the first regions 123 and 133 and the second regions 125 and 135 on the first and second upper electrode pads 121a and 131a are plated with materials having different compositions. For example, the first regions 123 and 133 of the first and second upper electrode pads 121a and 131a are plated with a material having high bonding reliability, e.g., Au, while the second regions 125 and 135 of the first and second upper electrode pads 121a and 131a are plated with a material having a high degree of reflectance, e.g., Ag. The first regions 123 and 133 and the second regions 125 and 135 may be formed to be in contact with only sides and end surfaces thereof, but may be formed to overlap each other according to an example embodiment. Additionally, according to an example embodiment, after top surfaces of the first and second upper electrode pads 121a and 131a are plated with Ag, only the first regions 123 and 133 may be plated with Au.

After the base substrate 110a is cut into individual units, each semiconductor light emitting device 200 is mounted on a corresponding individual base substrate 110. Accordingly, the semiconductor light emitting device package 10 illustrated in FIG. 1 is completed.

Figure 13:
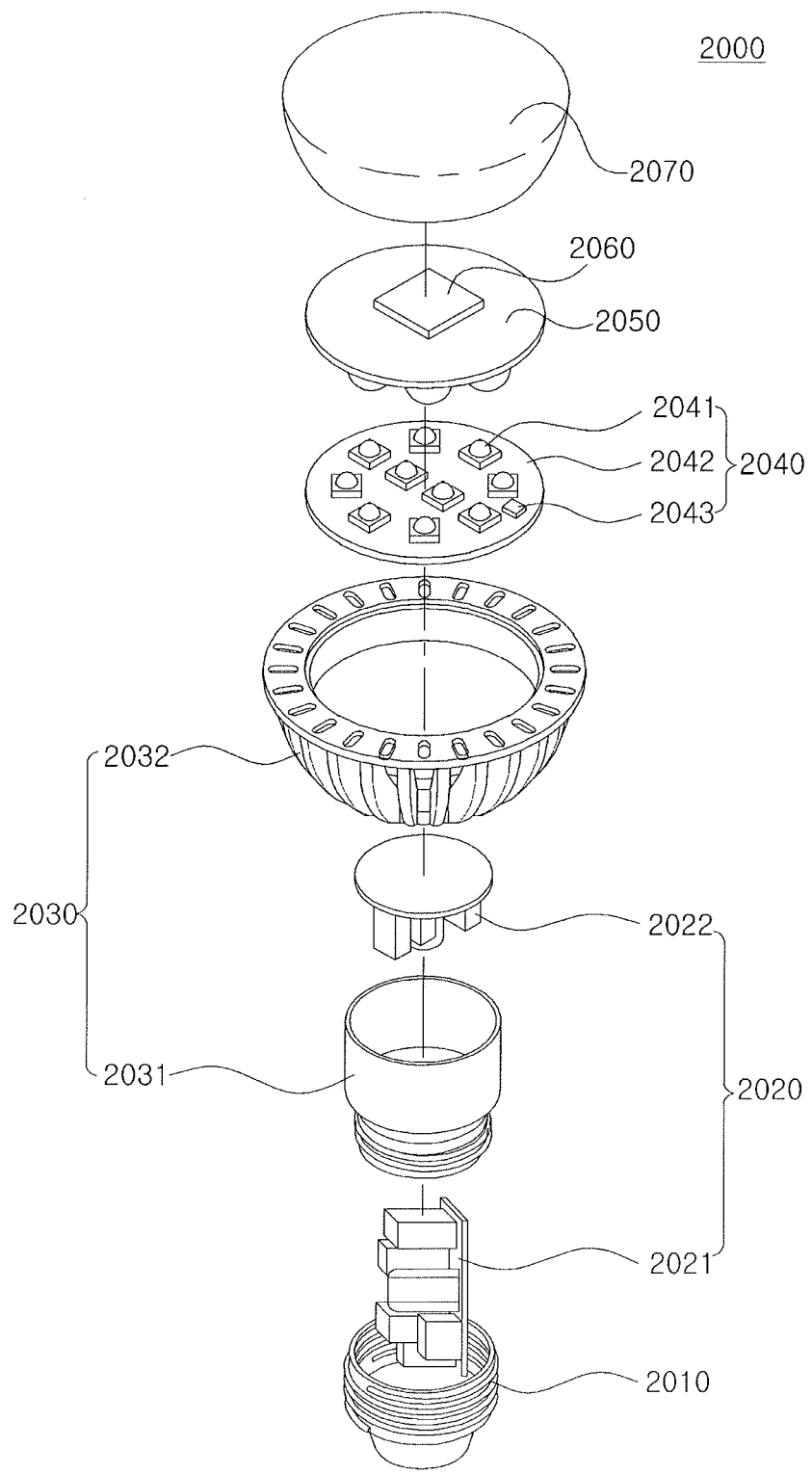
FIG. 13 illustrates a schematic exploded perspective view of a lamp, a lighting device, including a communications module according to an example embodiment of the present disclosure.

FIG. 13 is a schematic exploded perspective view of a lamp, i.e., a lighting device, including a communications module according to an example embodiment of the present disclosure.

With reference to FIG. 13, a lighting device 2000 may include a screw cap 2010, a power supply unit 2020, a heat radiating unit 2030, a light source module 2040, and a cover unit 2070.

Power supplied to the lighting device 2000 may be applied through the screw cap 2010. The screw cap 2010 may be configured to be compatible with a screw cap of an existing lighting apparatus. As illustrated, the power supply unit 2020 may include a first power supply portion 2021 and a second power supply portion 2022 separated, e.g., spaced apart, from and coupled to each other. The heat radiating unit 2030 may include an internal heat radiating portion 2031 and an external heat radiating portion 2032. The internal heat radiating portion 2031 may be directly connected to the light source module 2040 and/or the power supply unit 2020, by which heat may be transferred to the external heat radiating portion 2032. The cover unit 2070 may be configured in such a manner that light emitted from the light source module 2040 may be uniformly dispersed.

The light source module 2040 may receive power from the power supply unit 2020 and emit light to the cover unit 2070. The light source module 2040 may include one or more semiconductor light emitting devices 2041, a circuit board 2042, and a controller 2043, and the controller 2043 may store driving information of the semiconductor light emitting devices 2041 therein. The semiconductor light emitting devices 2041 may include a circuit board manufactured in a method of manufacturing a semiconductor circuit board detailed with reference to FIGS. 1 to 13 according to an example embodiment of the present disclosure, e.g., the semiconductor light emitting devices 2041 may include the semiconductor light emitting device packages 10, or may be a device manufactured by using the same.

A reflector 2050 may be disposed over the light source module 2040, and may enable light emitted by a light source to be uniformly dispersed laterally and backwardly, thereby reducing glare. A communications module 2060 may be mounted on the reflector 2050, and may allow home-network communications to be implemented. For example, the communications module 2060 may be a wireless communications module using Zigbee®, Wi-Fi, or Li-Fi, and may control lighting devices installed in the interior and on the exterior of a home by turning a lighting device on or off and adjusting a level of brightness thereof through a smartphone or a wireless controller. In addition, an electronic product in the interior and on the exterior of a home, such as a TV, a refrigerator, an air conditioner, a door lock, or the like as well as an automobile or an automotive system may be controlled through the Li-Fi communications module using a visible wavelength of light of a lighting device installed in the interior and on the exterior of a home. The reflector 2050 and the communications module 2060 may be covered by the cover unit 2070.

Figure 14:
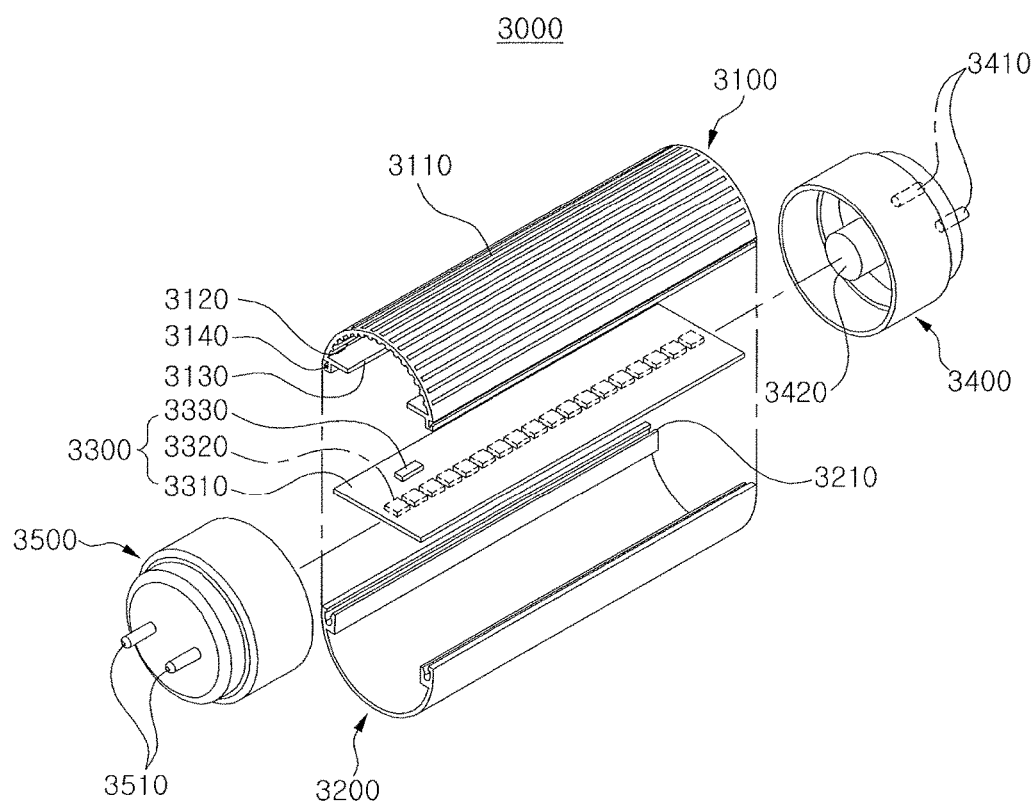
FIG. 14 illustrates a schematic exploded perspective view of a bar-type lamp in a lighting device according to an example embodiment of the present disclosure.

FIG. 14 is a schematic exploded perspective view of a bar-type lamp including a light emitting device according to an example embodiment of the present disclosure.

With reference to FIG. 14, a lighting device 3000 may include a heat radiating substrate 3100, a cover 3200, a light source module 3300, a first socket 3400, and a second socket 3500.

A plurality of heat radiating fins 3110 and 3120 having an unevenness form may be formed on an inner surface and/or an external surface of the heat radiating substrate 3100, and the heat radiating fins 3110 and 3120 may be designed to have various forms and intervals therebetween. A support portion 3130 having a protruding form may be formed inwardly of the heat radiating substrate 3100. The light source module 3300 may be fixed to the support portion 3130. A stop protrusion 3140 may be formed on opposing ends of the heat radiating substrate 3100.

The cover 3200 may include a stop groove 3210 formed therein, and the stop groove 3210 may be coupled to the stop protrusion 3140 of the heat radiating substrate 3100 in a hook coupling structure. Positions in which the stop groove 3210 and the stop protrusion 3140 are formed may be changed inversely.

The light source module 3300 may include a semiconductor light emitting device array. The light source module 3300 may include a printed circuit board 3310, a light source 3320, and a controller 3330. The light source 3320 may include a circuit board manufactured in a method of manufacturing a semiconductor circuit board detailed with reference to FIGS. 1 to 13 according to an example embodiment of the present disclosure, e.g., the semiconductor light emitting device package 10, or may be a device manufactured by using the same. The controller 3330 may store driving information of the light source 3320 therein. The printed circuit board 3310 may be provided with circuit wirings formed therein for operating the light sources 3320. In addition, constituent elements for operating the light sources 3320 may be provided.

The first and second sockets 3400 and 3500 may be provided as a pair of sockets and may have a structure in which they are coupled to opposing ends of a cylindrical cover unit configured of the heat radiating substrate 3100 and the cover 3200. For example, the first socket 3400 may include electrode terminals 3410 and a power supply device 3420, and the second socket 3500 may include dummy terminals 3510 disposed thereon. In addition, an optical sensor and/or a communications module may be disposed inside one of the first socket 3400 or the second socket 3500. For example, the optical sensor and/or the communications module may be installed within the second socket 3500 in which the dummy terminals 3510 are disposed. As another example, an optical sensor and/or a communications module may be installed within the first socket 3400 in which the electrode terminals 3410 are disposed.

By way of summation and review, as a temperature increases during bonding of a semiconductor light emitting device on a circuit board, problems, e.g., cracks, may be caused by a difference in coefficients of thermal expansion (CTE) between the semiconductor light emitting device and the circuit board. In addition, as semiconductor light emitting devices are gradually reduced in size, a bonding material coated on the circuit board may be disposed in a non-uniform manner, thereby causing abnormal mounting of the semiconductor light emitting device. e.g., compromising reliability and safety of electronic products.

In contrast, according to example embodiments, first and second electrodes are formed in a symmetrical manner (e.g., four-fold symmetry) to enable the same amount of solder to be coated on respective electrodes as a whole. As such, a semiconductor light emitting device may be mounted on a circuit board with reduced thermal stress and minimized defects during bonding (e.g., caused by an imbalance in an amount of a bonding material), thereby increasing produce reliability.

In addition, each electrode is divided into two regions (e.g., mounting and reflection regions), with each region being plated with a different material to allow for a mounting region having excellent bonding properties, and a reflection region having a high degree of reflectance. As such, both bonding and reflective properties may be simultaneously improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device package, comprising:
    a semiconductor light emitting device including a plurality of electrodes;
    a circuit board including a mounting region, the semiconductor light emitting device being positioned on the mounting region of the circuit board; and
    a plurality of electrode pads on the circuit board, the plurality of electrode pads being electrically connected to the plurality of electrodes,
    wherein each of the plurality of electrode pads includes a first region and a second region, the first region overlapping the mounting region, and the second region excluding the first region,
    wherein a single semiconductor light emitting device overlaps all the first regions of the plurality of electrode pads, and wherein all the second regions of the plurality of electrode pads have a non-overlapping relationship with the semiconductor light emitting device, all the second regions of the plurality of electrode pads including a material having a higher reflectance than a material of the first regions of the electrode pads, and wherein the plurality of electrode pads is arranged in a shape of rotational symmetry around a pivot point of the mounting region.

2. The semiconductor light emitting device package as claimed in claim 1, wherein each of the plurality of electrode pads has the same shape.

3. The semiconductor light emitting device package as claimed in claim 1, wherein a composition of a material in the first region of each of the plurality of electrode pads is different from a composition of a material in the second region of each of the plurality of electrode pads.

4. The semiconductor light emitting device package as claimed in claim 1, wherein a degree of reflectance of the second region of each of the plurality of electrode pads is greater than a degree of reflectance of the first region of each of the plurality of electrode pads.

5. The semiconductor light emitting device package as claimed in claim 1, further comprising a bonding material and a flip-chip structure between the semiconductor light emitting device and the first region of each of the plurality of electrode pads.

6. The semiconductor light emitting device package as claimed in claim 5, wherein the bonding material includes a material having a same composition as a material in the first region of each of the plurality of electrode pads.

7. The semiconductor light emitting device package as claimed in claim 1, wherein the plurality of electrode pads are physically separated from each other to be electrically insulated.

8. The semiconductor light emitting device package as claimed in claim 7, wherein the plurality of electrode pads are electrically insulated by an insulating reflective layer.

9. The semiconductor light emitting device package as claimed in claim 8, wherein the insulating reflective layer includes at least one of $TiO_2$, $SiO_2$, SiN, $Si_3N_4$, $Al_2O_3$, TiN, AlN, $ZrO_2$, TiAlN, TiSiN, and $Nb_2O_3$.

10. The semiconductor light emitting device package as claimed in claim 1, wherein the plurality of electrodes and the first regions of the plurality of electrode pads have shapes corresponding to each other, respectively, the plurality of electrodes and the first regions of the plurality of electrode pads completely overlapping each other and being stacked on top of each other between the circuit board and the semiconductor light emitting device.

11. The semiconductor light emitting device package as claimed in claim 1, wherein the circuit board is a ceramic circuit board.

12. The semiconductor light emitting device package as claimed in claim 1, wherein the first region includes a material containing gold (Au).

13. A circuit board for mounting of a semiconductor light emitting device, comprising:
a base substrate having first and second surfaces opposing each other; and
a plurality of electrode pads on the first surface of the base substrate, the plurality of electrode pads being arranged in a shape of rotational symmetry around a central region of the base substrate as viewed in a top view,
wherein each of the plurality of electrode pads includes first and second regions, the first and second regions having upper surfaces level with each other and lower surfaces level with each other, and each first region including a conductive material layer having a different composition than a corresponding second region.

14. The circuit board for mounting of a semiconductor light emitting device as claimed in claim 13, wherein the plurality of electrode pads are arranged to have the first regions face each other around the central region of the base substrate, the second regions having a higher reflectance than the first regions and defining a frame surrounding the first regions.

15. A semiconductor light emitting device package, comprising:
a semiconductor light emitting device including a plurality of electrodes;
a circuit board, the semiconductor light emitting device being positioned on the circuit board; and
a plurality of electrode pads on the circuit board, the plurality of electrode pads being electrically connected to the plurality of electrodes of the semiconductor light emitting device, respectively,
wherein each of the plurality of electrode pads includes a first region and a second region, the first and second regions including different material layers, and the semiconductor light emitting device overlapping only the first region among the first and second regions of each of the electrode pads.

16. The semiconductor light emitting device package as claimed in claim 15, wherein:
the plurality of electrodes of the semiconductor light emitting device are on a lower surface of the semiconductor light emitting device facing the circuit board,
the plurality of electrode pads are on an upper surface of the circuit board facing the semiconductor light emitting device, the plurality of electrodes and the plurality of electrode pads being between the circuit board and the semiconductor light emitting device, and
a number of the electrodes and a shape of the electrodes are the same as those of the electrode pads, each electrode of the plurality of electrodes contacting a corresponding one of the plurality of electrode pads.

17. The semiconductor light emitting device package as claimed in claim 16, wherein each first region includes a first material layer in direct contact with a corresponding electrode, and each second region includes a second material having a different material composition than the first material layer.

18. The semiconductor light emitting device package as claimed in claim 17, wherein the first and second material layers exhibit different degrees of both bonding and reflectance.

19. The semiconductor light emitting device package as claimed in claim 15, wherein:
the first regions of the electrode pads are arranged adjacent to each other, the first regions of all the electrode pads overlapping a center of the circuit board while being completely covered by the light emitting device, and
the second regions of the electrode pads are in a same layer as the first regions and overlap a periphery of the circuit board, all the second regions being arranged in a frame shape to surround all the first regions.

* * * * *